(12) United States Patent
McTeer

(10) Patent No.: US 6,261,947 B1
(45) Date of Patent: Jul. 17, 2001

(54) FORMATION OF ELECTRICAL CONTACTS TO CONDUCTIVE ELEMENTS IN THE FABRICATION OF SEMICONDUCTOR INTEGRATED CIRCUITS

(75) Inventor: Allen McTeer, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/252,697

(22) Filed: Feb. 18, 1999

(51) Int. Cl.⁷ .................................................. H01L 21/4763
(52) U.S. Cl. ......................... 438/637; 618/622; 618/624; 618/648
(58) Field of Search .................................... 438/618, 622, 438/623, 624, 625, 626, 636, 637, 648

(56) References Cited

U.S. PATENT DOCUMENTS

| | | | |
|---|---|---|---|
| 4,184,909 | * | 1/1980 | Chang et al. .......................... 438/624 |
| 4,948,459 | * | 8/1990 | van Laaarhoven et al. .......... 438/622 |
| 5,281,850 | * | 1/1994 | Kanamori ............................. 257/758 |
| 5,612,254 | * | 3/1997 | Mu et al. .............................. 438/634 |
| 5,635,423 | * | 6/1997 | Huang et al. ......................... 438/638 |
| 5,693,563 | | 12/1997 | Teong . |
| 5,705,430 | | 1/1998 | Avanzino et al. . |
| 5,736,457 | | 4/1998 | Zhao . |
| 5,814,557 | | 9/1998 | Venkatraman et al. . |
| 6,025,259 | * | 2/2000 | Yu et al. .............................. 438/618 |

* cited by examiner

Primary Examiner—Stephen D. Meier
Assistant Examiner—Maria Guerrero
(74) Attorney, Agent, or Firm—Dickstein Shapiro Morin & Oshinsky LLP

(57) ABSTRACT

A method of fabricating a contact for electrical connection to a conductive element of an integrated circuit includes partially forming a via in a layer over the conductive element. The via can be defined by an opening in a photoresist pattern. The photoresist pattern is removed prior to exposure of the conductive element at a bottom of the via, and a blanket etch is subsequently performed to expose the conductive element at the bottom of the via. Removing the photoresist pattern can include stripping the photoresist pattern in an ambient comprising oxygen. The via then can be substantially filled with a conductive material. The techniques are particularly advantageous when the previously-formed conductive element is easily oxidizable, for example, where the conductive element includes copper. The techniques can obviate the need to employ less desirable organic solvents to remove the photoresist masks and can improve the quality of the electrical contact.

30 Claims, 11 Drawing Sheets

FORMATION OF ELECTRICAL CONTACTS TO CONDUCTIVE ELEMENTS IN THE FABRICATION OF SEMICONDUCTOR INTEGRATED CIRCUITS

BACKGROUND

The present invention relates generally to semiconductor devices and, more particularly, to the formation of electrical contacts to conductive elements in semiconductor integrated circuits.

One technique for forming a metallization pattern on an integrated circuit is to etch a conductor pattern into an insulating layer to form an inlaid pattern or grooves. A metal layer then is deposited to fill the etched grooves. Typically, the metal layer not only fills the grooves, but also covers the entire semiconductor wafer. The excess metal over the wafer surface is removed either by a chemical-mechanical polishing process or by an etchback process. In-laid conductors, thus, are formed in the insulating layer. Such a process also is known as a damascene process.

Vias are needed to connect different metallization layers. In damascene processes, the vias are formed in the insulating layer and subsequently are filled with metal. The excess metal over the wafer surface is removed. Formation of the vias is followed either by a standard metallization process or by a damascene conductor layer as described above. Forming the vias and conductors separately is referred to as a single damascene process. According to a simpler process, the vias and the metallization patterns are formed in the insulating layer, followed by a single metal filling and excess metal removal process. Formation of the vias and conductors together is referred to as a dual damascene process.

The dual damascene process is used, for example, to form multi-level signal lines of metal for a multi-layer substrate on which the semiconductor devices are mounted. Thus, a first or lower metal interconnect line can be electrically in contact with a doped region of the substrate of an integrated circuit device. One or more metal interconnections are formed between the first metallization level and other portions of the device or to structures external to the integrated circuit device. Those interconnections are accomplished, in part, by the second level of wiring lines.

In a standard dual damascene process, the insulating layer is coated with a resist and exposed to a first mask with an image pattern of via openings. The pattern is anisotropically etched in the upper half of the insulating layer. After removal of the patterned resist, the insulating layer is coated with a resist and exposed to a second mask with an image pattern of conductive lines in alignment with the vias. During the anisotropic etch of the openings for the conductive lines, the via openings are simultaneously etched in the lower half of the insulating layer. After etching is completed, the resist is stripped for example, using an oxygen plasma. The vias and the grooves for the conductors then are filled with metal.

Aluminum (Al) is often used for the metallization. However, metals such as copper (Cu) are desirable for use as conducting lines because they have good electrical conductivity and are resistant to electro-migration which can occur in Al. Therefore, Cu is an attractive replacement for Al due to its low cost and ease of manufacturing. Nevertheless, one difficulty in using Cu for conducting lines results from the high susceptibility of Cu to oxidation. As noted above, the photoresist used for patterning typically is removed at the end of processing by heating it in a highly oxidizing environment, such as an oxygen plasma, to convert the photoresist into an easily removable ash. During such ashing processes, the lower Cu conductive line, which is subjected to the oxidizing ambient, will become oxidized, thereby, causing a deterioration in the electrical properties of the metal contacts. Such problems are not limited to the fabrication of dual damascene structures or the use of Cu as the conductive material. However, such a structure highlights the type of problems that may be encountered when a contact needs to be made to a conductive element that can become oxidized when exposed to oxygen.

One technique for avoiding the oxidation of the lower Cu metallization layer is to employ an organic solvent to remove the photoresist. However, such solvents are expensive and are hazardous to the environment. Accordingly, alternative techniques that avoid the foregoing problems are desirable.

SUMMARY

In general, according to one aspect, a method of fabricating a contact for electrical connection to a conductive element of an integrated circuit includes partially forming a via in a layer over the conductive element. The via can be defined by an opening in a photoresist pattern. The photoresist pattern is removed prior to exposure of the conductive element at a bottom of the via, and a blanket etch is subsequently performed to expose the conductive element at the bottom of the via. The via then can be substantially filled with a conductive material.

Various implementations include one or more of the following features. Removing the photoresist pattern can include stripping the photoresist pattern in an ambient comprising oxygen. For example, the photoresist pattern can be stripped by heating the photoresist in an oxygen-based plasma. The blanket etch can include performing an anisotropic dry etch such as a reactive ion etch.

In some implementations, an insulating or passivating layer is provided over the conductive element. The insulating layer can include a first and second sub-layers formed of different materials. The insulating layer can be etched to form a contact opening defined by the photoresist pattern, and etching of the insulating layer can be halted when the lower sub-layer becomes exposed. After removing the photoresist pattern, the blanket etch can be performed to expose the conductive element at the bottom of the contact opening.

The insulating or passivation layer can be etched using various techniques, including reactive ion etching in which a reactant gas comprising a fluorine-based compound is used. Preferably, the etch rate of the first sub-layer is less than an etch rate of the second sub-layer using the reactant gas. etching of the first sub-layer can be detected to determine when the act of halting should be performed.

The techniques are particularly advantageous when the previously-formed conductive element is easily oxidizable, for example, where the conductive element includes copper. The techniques can obviate the need to employ less desirable organic solvents to remove the photoresist masks and can improve the quality of the electrical contact. In particular, a photolithographic mask, such as a resist pattern used during formation of the electrical contact, can be stripped from the wafer without oxidizing a previously-formed conductive element. Thus, integrated circuits can be fabricated to take advantage of the excellent electrical properties of copper, including its high electrical conductivity and resistance to electro-migration, as well as its low cost and ease of manufacturing.

The techniques can be used to form a dual damascene structure for electrical connection to a conductive element.

Thus, according to one aspect, a method of forming a dual damascene structure includes partially forming, in an insulating layer over the conductive element, an opening for a conductive line and a via opening for interconnection between the conductive line and the conductive element using photoresist masks. The photoresist masks can be removed or stripped in an ambient including oxygen prior to exposure of the conductive element at the bottom of the via opening. Subsequently, a blanket etch is performed to expose the conductive element at the bottom of the via opening, and the opening for the conductive line and the via opening are substantially filled with a conductive material.

As a result of the blanket etch, the upper side edges of the opening for the conductive line, as well as the upper side edges of the via opening, can be less faceted than in prior processes. The less-faceted upper side edges can facilitate the subsequent filling of the openings with a conductive material and can result in higher quality contacts.

In addition to the processes describe above, according to another aspect, an integrated circuit includes a semiconductor wafer, a conductive element formed over a region of the wafer and a conductive contact electrically connected to the conductive element. The contact has substantially vertical sidewalls and sloping upper side edges such that the substantially vertical sidewalls and the upper side edges form an exterior angle greater than ninety degrees and less than one-hundred and eighty degrees. In some implementations, the conductive element includes an oxidizable material, such as copper, and can be, among other things, a conductive pad, a conductive plug, or a conductive line in electrical contact with an active region of the semiconductor wafer.

Other features and advantages will be readily apparent from the following detailed description, the accompanying drawings, and the claims.

DETAILED DESCRIPTION

Figure 1:
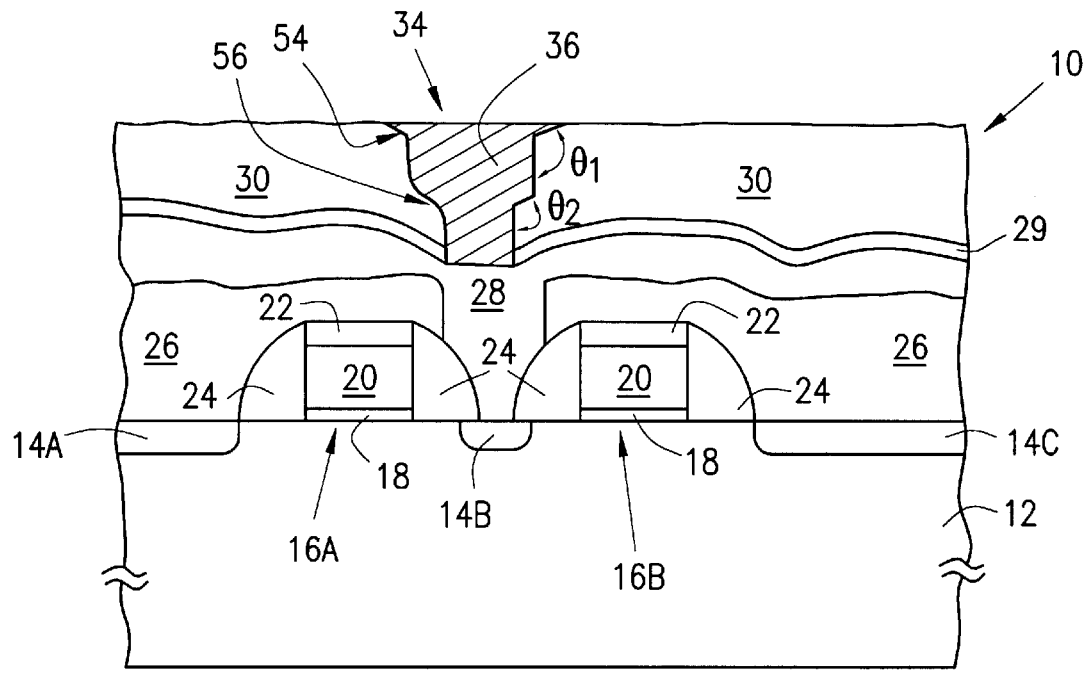
FIG. 1 illustrates a cross-section of an exemplary integrated circuit with a dual damascene structure electrically connected to a lower conductive line according to the invention.

Referring to FIG. 1, an exemplary integrated circuit 10 is fabricated on a semiconductor or other substrate 12 which may include one more previously-formed layers, active areas and doped regions. The integrated circuit 10 includes a first or lower conductive line 28 connected electrically to a second or upper conductive line 34 by a conductive interconnection or plug 36. In one implementation, the lower conductive line 28 serves as a local interconnect line for a static random access memory (SRAM).

Still referring to FIG. 1, doped regions 14A, 14B and 14C of the substrate 12 form the source and drain regions of two transistors 16A, 16B. Each transistor 16A, 16B includes a polysilicon (polySi) gate layer 20 disposed over a gate dielectric layer 18. A thin refractory metal or refractory metal silicide layer 22 can be provided over the polySi gate layer 20. Nitride spacers 24 are formed on either side of the gate layers 18, 20, 22. An insulating layer 26 formed, for example, of boro-phospho-silicate glass (BPSG), phospho-silicate glass (PSG) or tetraethylorthosilicate (TEOS), partially covers the transistors 16A, 16B.

As shown in FIG. 1, the lower conductive line 28 is electrically in contact with the doped region 14B. The upper conductive line 34 electrically connects the lower conductive line 28 to other portions of the device or to structures external to the integrated circuit device (not shown). The conductive lines 28, 34 and the plug 36 comprise a conductive material. Exemplary materials include copper (Cu), aluminum (Al), tungsten (W), titanium (Ti) and cobalt (Co), among others. The techniques described below are particularly advantageous when the lower conductive line 28 includes a material, such as Cu, which easily oxidizes when exposed to an ambient comprising oxygen and whose oxidation is not self-limiting.

The upper conductive line 34 is surrounded by one or more insulating sub-layers 29, 30. As illustrated in FIG. 1, a first thin insulating sub-layer 29 acts as a diffusion barrier and as a passivation layer. The first insulating sub-layer 29 can include a dielectric, for example, silicon nitride ($Si_xN_y$), silicon dioxide ($SiO_2$) or silicon oxynitride ($SiO_xN_y$). In some implementations, the thickness of the insulating sub-layer 29 is in the range of about 100 to about 1,000 angstroms (Å). The sub-layer 29 also can serve as an etch-stop layer as described in greater detail below. The relatively thick, uniform second sub-layer 30 includes a dielectric such as BPSG, PSG or TEOS, and also acts as a passivation layer. In some implementations, the thickness of the second sub-layer 30 is in the range of about 5,000 to about 20,000 Å. Thus, in some implementations, the second sub-layer 30 may be only several times thicker than the first sub-layer 29. In other implementations, the second sub-layer 30 may be as much as several hundred times as thick as the first sub-layer 29.

The lower conductive line 28 can be formed, for example, by a damascene technique such that it is substantially planarized. Alternatively, the lower conductive line 28 can be formed by a reactive ion etch (RIE) or etchback process such that the resulting surface has topography.

The plug 36 and the interconnection 34 can be formed by a dual damascene process which includes etching through the insulating sub-layers 29, 30 and subsequently filling in the etched regions with a conductive metal. Details of the dual damascene process are described in greater detail below with respect to FIGS. 3A, 3B, 4, 5A, 5B, 6, 7 and 8.

Figure 3A:
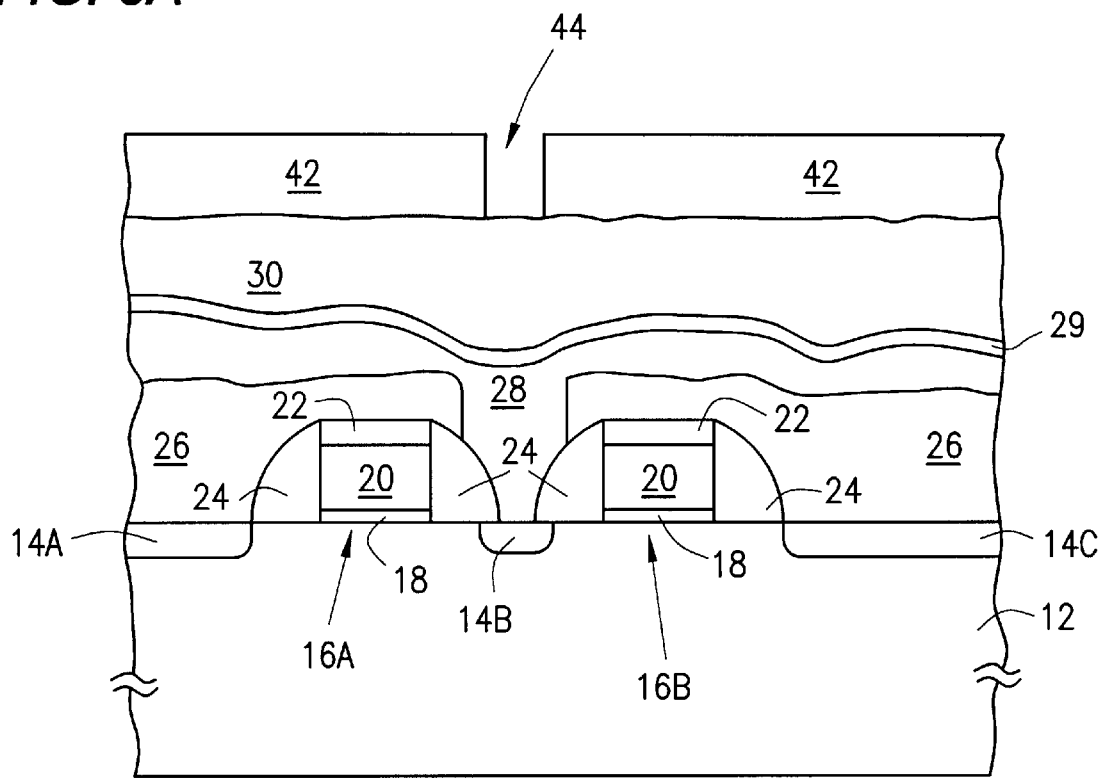
FIGS. 3A, 3B, 4, 5A, 5B, 6, 7 and 8 illustrate cross-sections of the structure of FIG. 1 during various stages in the fabrication of the dual damascene structure.
Figure 3B:
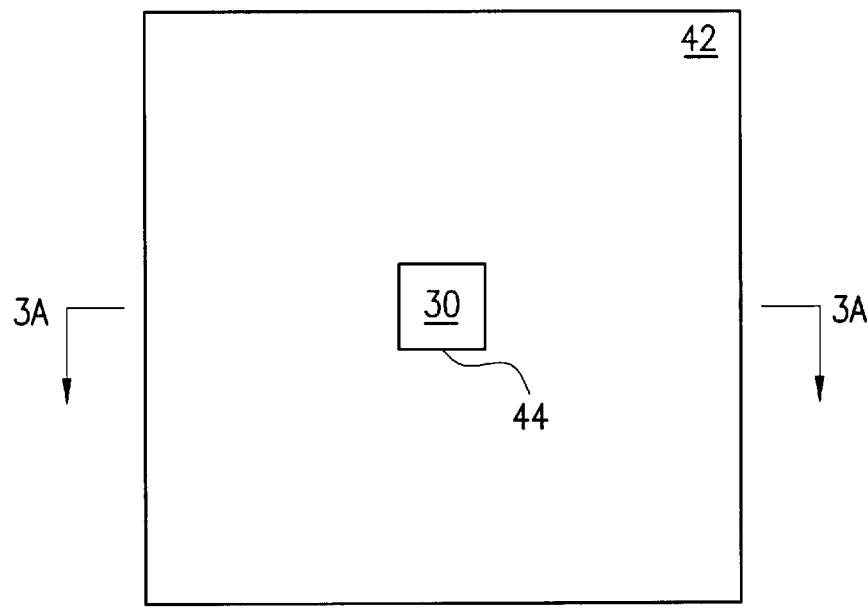

Referring to FIG. 3A and 3B, the formation of the dual damascene structure begins with the sub-layers 29, 30 already formed over a conductive element, in this case the lower conductive line 28. A first photoresist pattern or mask 42 with at least one via opening 44 is provided over the upper surface of the insulating layer 30.

Figure 4:
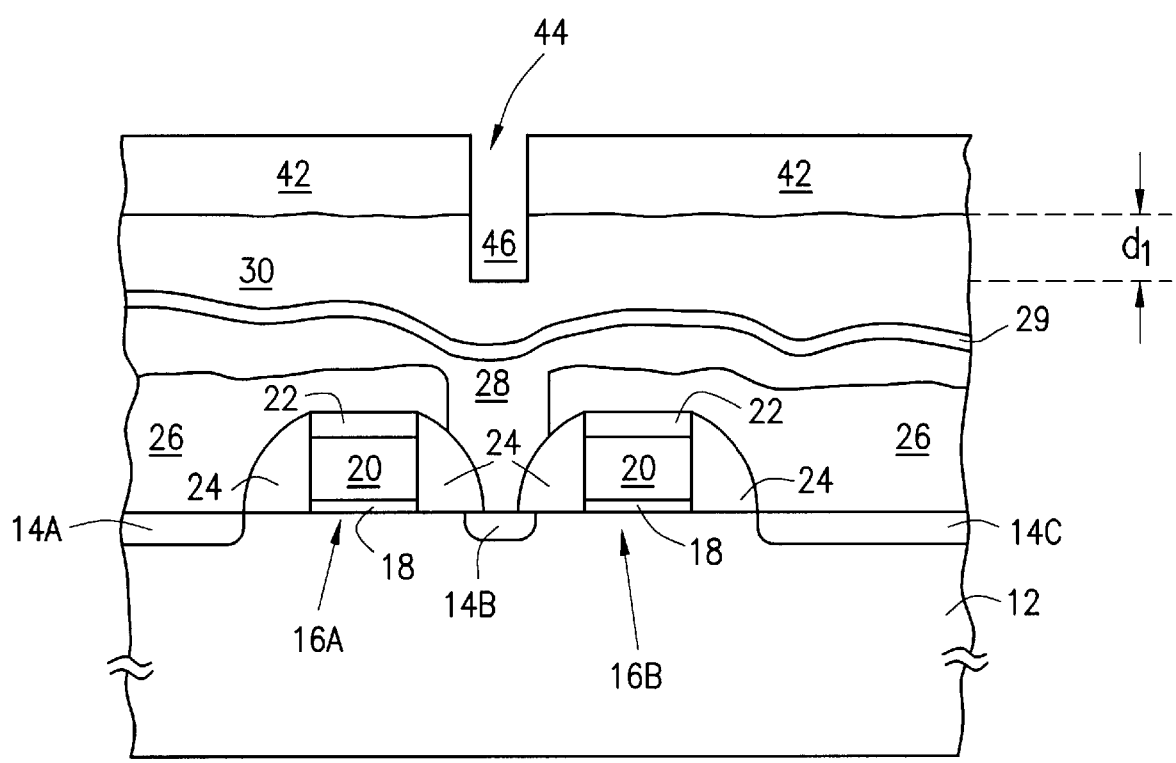

A via 46 is etched in the upper portion of the insulating layer 30 to a depth of approximately half-way to the lower conductive element 28 (FIG. 4). Thus, for example, if the thicknesses of the insulating sub-layers 29, 30 are about 1,000 Å and 12,000 Å, respectively, then the via 46 initially is etched to a depth $d_1$ of about 6,500 Å. The via 46 corresponds to the opening 44 in the photoresist pattern 42 with the photoresist pattern acting as an etch barrier. The initial etch can be performed using an dry anisotropic etch, such as an RIE etch with a gaseous plasma based on fluorinated hydrocarbons. For example, a commercially available parallel plate RIE apparatus can be used with carbon tetrafluoride ($CF_4$) as the reactant gas. The $CF_4$ gas can be mixed with other gases such as trifluoromethane ($CHF_3$), argon (Ar), nitrogen ($N_2$) or a mixture of those gases. Alternatively, perfluoroethane ($C_2F_6$) or $SF_6$ can be used as the reactant gas with a mixture of hydrobromide (HBr) or helium (He).

Figure 5A:
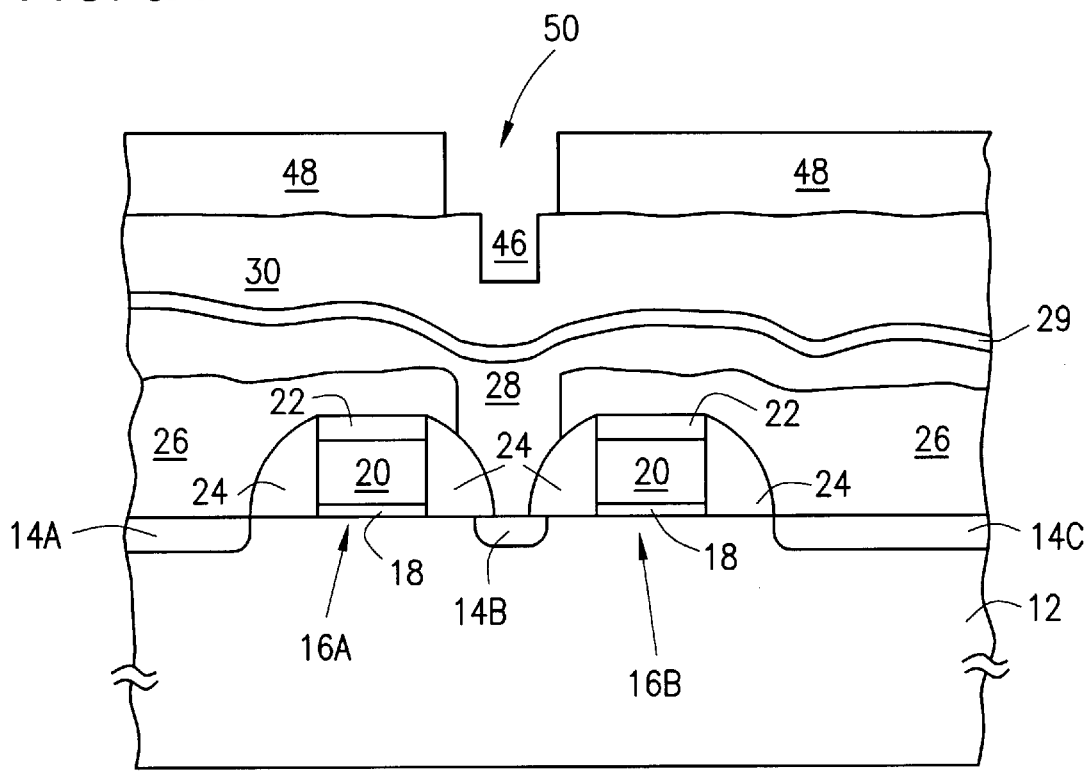
Figure 5B:
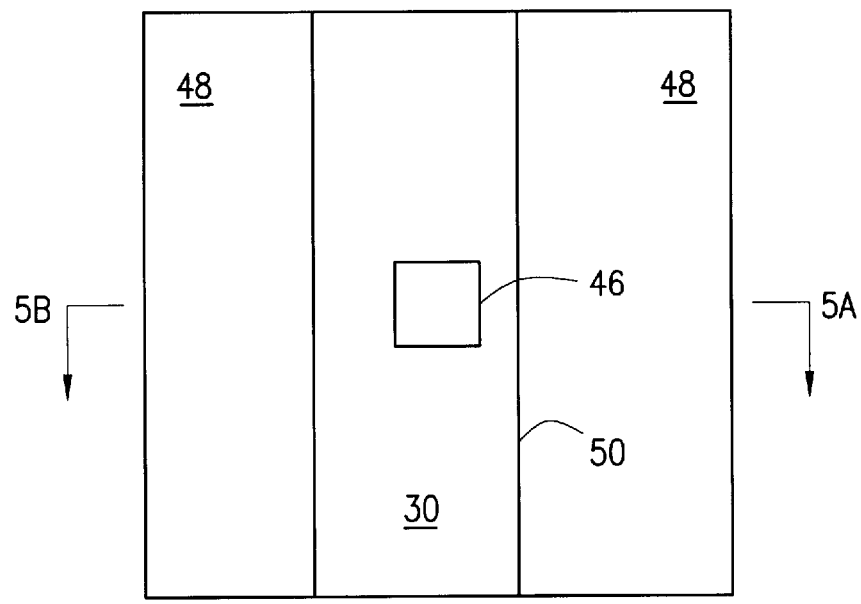
Figure 6:
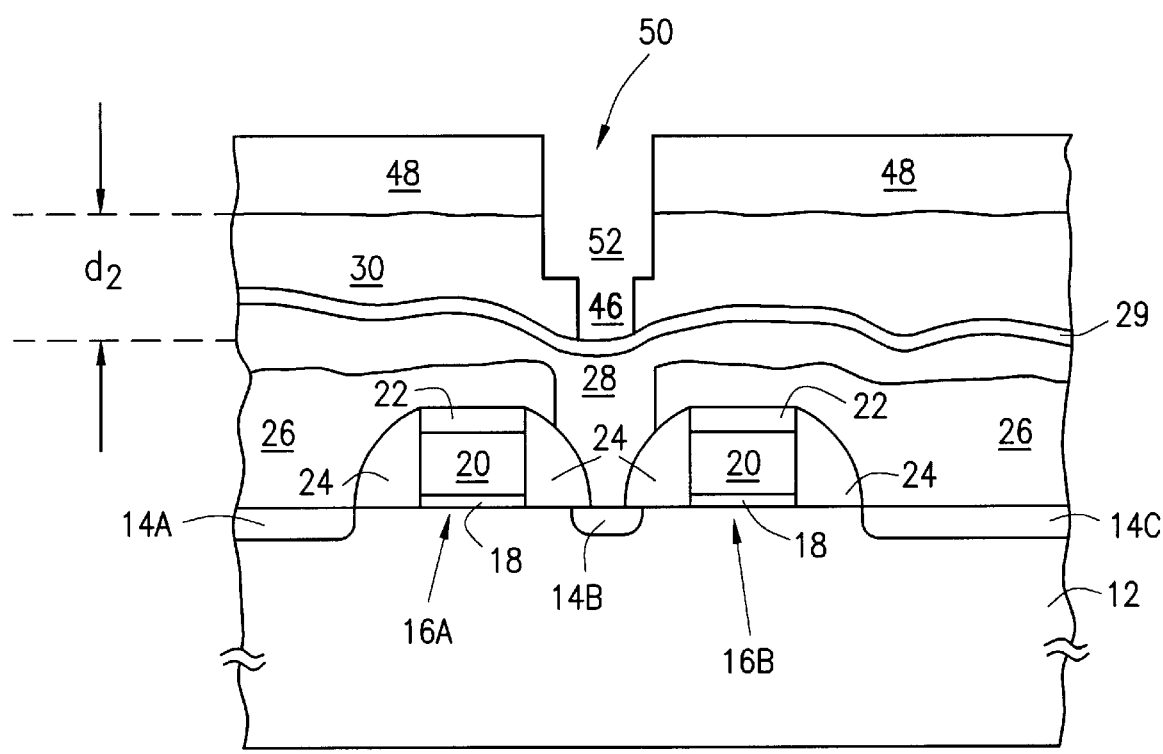
Figure 7:
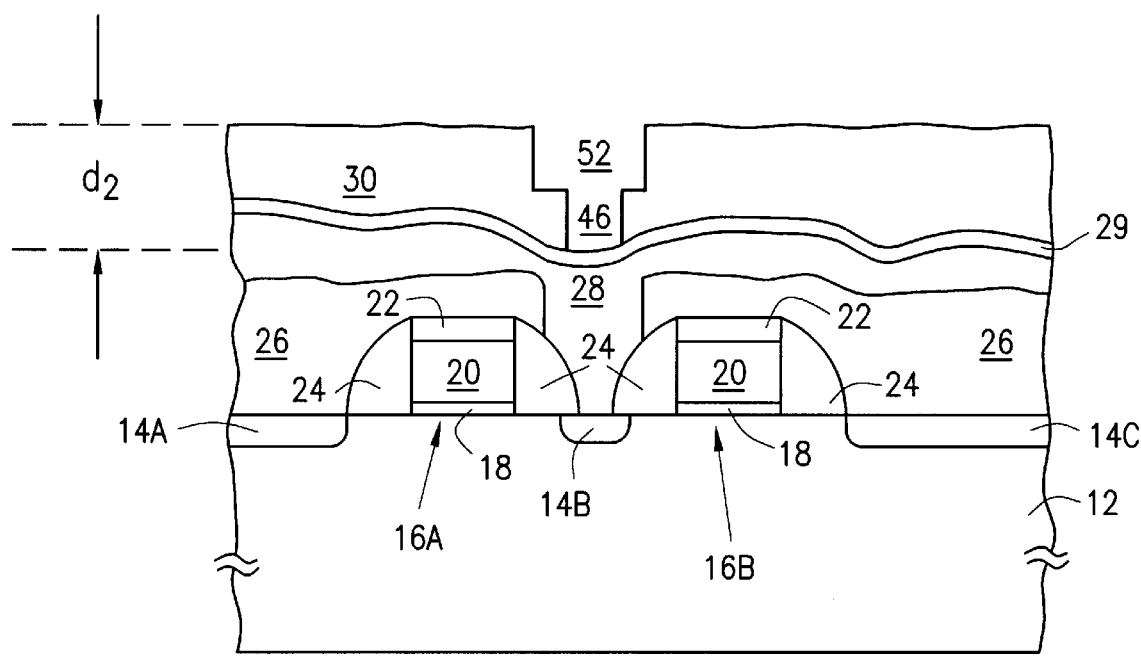

Upon completion of the initial etch (FIG. 4), the photoresist pattern 42 is stripped or removed, for example, by heating the photoresist in an oxygen-based ambient such as an oxygen-based plasma. A second photoresist pattern or mask 48 with a conductive line pattern 50 is provided over the upper surface of the sub-layer 30 and is aligned with the via opening 46 (FIG. 5A). The conductive line pattern 50, which generally is wider than the via opening 46, is etched anisotropically in the upper portion of the insulating sub-layer 30 to form an opening 52 for the plug 36. At the same time, the pattern of the via opening 46, which is exposed to the same etchant gas(es), is etched in the lower portion of the insulating sub-layer 30 to a depth $d_2$, in other words, to approximately the upper surface of the insulating sub-layer 29 (FIG. 6). In the illustrated embodiment, the depth $d_2$ is about 12,000 Å such that the bottom of the via opening 26 is approximately 1,000 Å from the lower conductive element 28. More generally, the second etch should be halted prior to any portion of the lower conductive element 28 becoming exposed at the bottom of the via opening 46.

The second etch can be performed using the same or similar techniques as discussed above with respect to the initial etch. Preferably, the particular etchants are selected such that the etch rate of the insulating sub-layer 29 is significantly less than the etch rate of the insulating sub-layer 30 to allow the sub-layer 29 to act as an etch-stop layer. For example, using the fluorine-based etchants mentioned above with an insulating sub-layer 29 comprising $Si_xN_y$ and an insulating sub-layer 30 comprising TEOS, the etch rate of the $Si_xN_y$ sub-layer should be less than the etch rate of the TEOS sub-layer.

Various techniques can be used to ensure that the second etch is halted prior to any of the lower conductive element 28 becoming exposed as a result of the etch. For example, according to one implementation, the second etch process is stopped after a pre-selected duration has elapsed. The pre-selected duration can be determined experimentally using an optical end-point detection technique or a residual gas analysis end-point detection technique.

Alternatively, in other embodiments, the second etch process can be halted automatically once etching of any portion of the insulating sub-layer 29 is detected. An optical end-point detection apparatus, such as an optical emission spectrometer end-point detector or a residual gas analysis end-point detector, can be coupled to the etch system controller for that purpose. For example, a significant change, such as an increase, in the level of emission of one or more by-products of the insulating sub-layer 29 would indicate that etching of that sub-layer has begun. Thus, if the sub-layer 29 comprises $Si_xN_y$ and the sub-layer 30 comprises TEOS, changes in the level of nitrogen detected can be used to indicate that etching of the sub-layer 29 has commenced.

Once the second etch is completed (FIG. 6), the photoresist pattern 48 is stripped or removed (FIG. 7), for example, by heating the photoresist in an oxygen-based ambient, such as an oxygen-based plasma.

Figure 8:
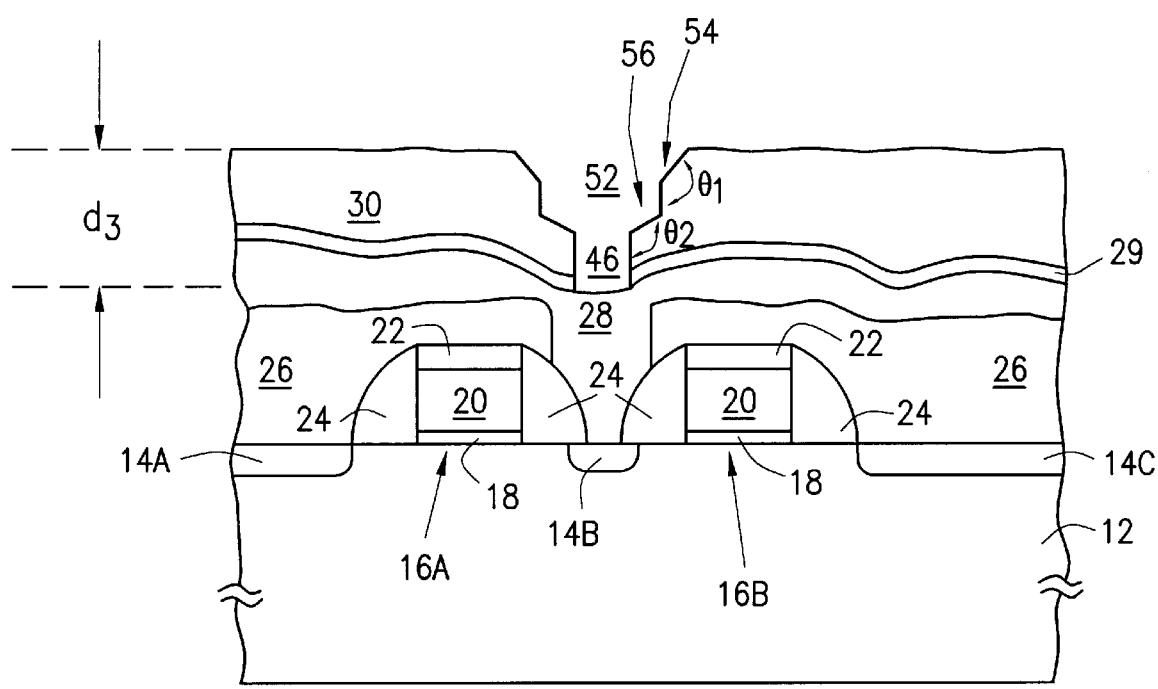
Figure 9:
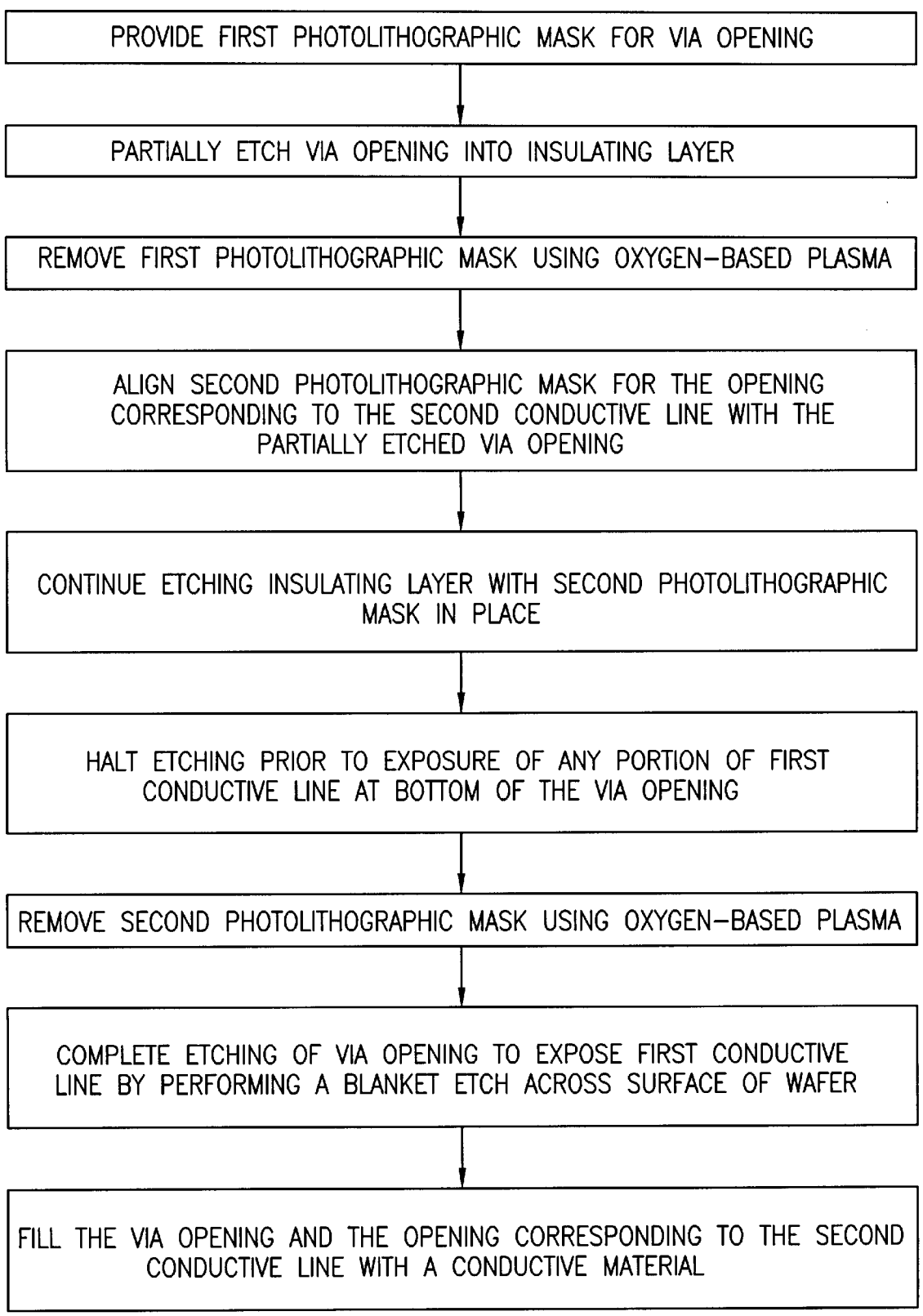
FIG. 9 is a flow chart illustrating various acts in the fabrication of the dual damascene structure according to the invention.

To complete formation of the via opening 46 as well as the opening 52 for the plug 36, a blanket anisotropic etch across the entire surface of the wafer is performed. In other words, an etch process is performed in the absence of a photoresist pattern on the surface of the wafer. The duration of this third etch process should be sufficiently long so that the via opening 46 extends through the insulating sub-layer 29 to expose the conductive element 28 completely at the bottom of the via opening (FIG. 8). The third etch can be performed using the same or similar techniques as discussed above with respect to the initial and second etches. As a result of the blanket etch, the thickness of the insulating sub-layer 30 will be somewhat reduced so that the thickness $d_3$ of the insulating sub-layer 30 is somewhat less than its original thickness $d_2$. Therefore, the initial thickness of the sub-layer 30 should be selected to take this reduction in thickness into account.

As a result of the blanket etch, the upper side edges 54 of the opening 52 of the plug 36, as well as the upper side edges 56 of the opening 46, can be less faceted. In other words, the exterior angle θ 12 between the substantially vertical sidewalls of the opening 46 and the edges 56 can be greater than ninety degrees and less than one-hundred and eighty degrees. Similarly, the exterior angle θ 1 between the substantially vertical sidewalls of the opening 52 and the edges 54 can be greater than ninety degrees and less than one-hundred and eighty degrees. The less-faceted edges 54, 56 can facilitate subsequent filling of the openings 46, 52 with a conductive material. Care should be taken not to allow the edges 54, 56 to become too flat because that can result in increased leakage or shorts between adjacent metal lines. In some implementations, either or both of the edges 54, 56 may slope at an angle of about forty-five degrees or more relative to the horizontal surface of the substrate 12, thereby forming exterior angles $θ_1$, $θ_2$, of about 135 degrees or more. For the thickness values discussed above, the top surface of the insulating layer 16 can be etched approximately an additional 2,000 Å to ensure that the bottom of the via opening 46 exposes the lower conductive element 28.

Following completion of the third etch (FIG. 8), the via opening 46 and the opening 52 for the upper conductive line are filled with Cu or another conductive material to form the plug 36 and the upper conductive line 32, as shown in FIG. 1. A single metal deposition process can be used for that purpose. Excess metal over the wafer surface can be removed either by a chemical-mechanical polishing process or by an etchback process. Additional layers, such as a passivation layer, can be provided over the upper conductive line 32 using known techniques.

The foregoing technique allows the metallization lines, including the lower conductive element 28, to be formed with a material such as Cu, even though Cu oxidizes quickly. Thus, integrated circuits can be fabricated to take advantage of the excellent electrical properties of Cu, such as good electrical conductivity and resistance to electro-migration, as well as its low cost and ease of manufacturing. Furthermore, the techniques described above allow oxygen-based plasmas to be used to strip the photolithographic masks from the wafer without oxidizing the lower conductive line and obviate the need to employ environmentally hazardous organic solvents. In addition, devices with better reliability can be fabricated because the less-faceted edges 54, 56 allow the openings 46, 52 to more easily and completely be filled with a conductive material.

Although the foregoing discussion relates to formation of a dual damascene structure for connection to a previously-formed conductive line, the techniques described above also can be used to form one or more electrical contacts to other conductive elements, including a plug or loading pad. For example, referring to FIG. 2, an integrated circuit 10A includes some of the same elements as the integrated circuit of FIG. 1. However, instead of the lower conductive line 28, a plug 36 provides the connection to the doped region 14B. In one embodiment, the plug 36 comprises polysilicon, other conductive materials can be used. A contact 38 is connected electrically to the plug 36. Formation of a via for the contact 38 is discussed in greater detail below with respect to FIGS. 10, 11 and 12.

Figure 10:
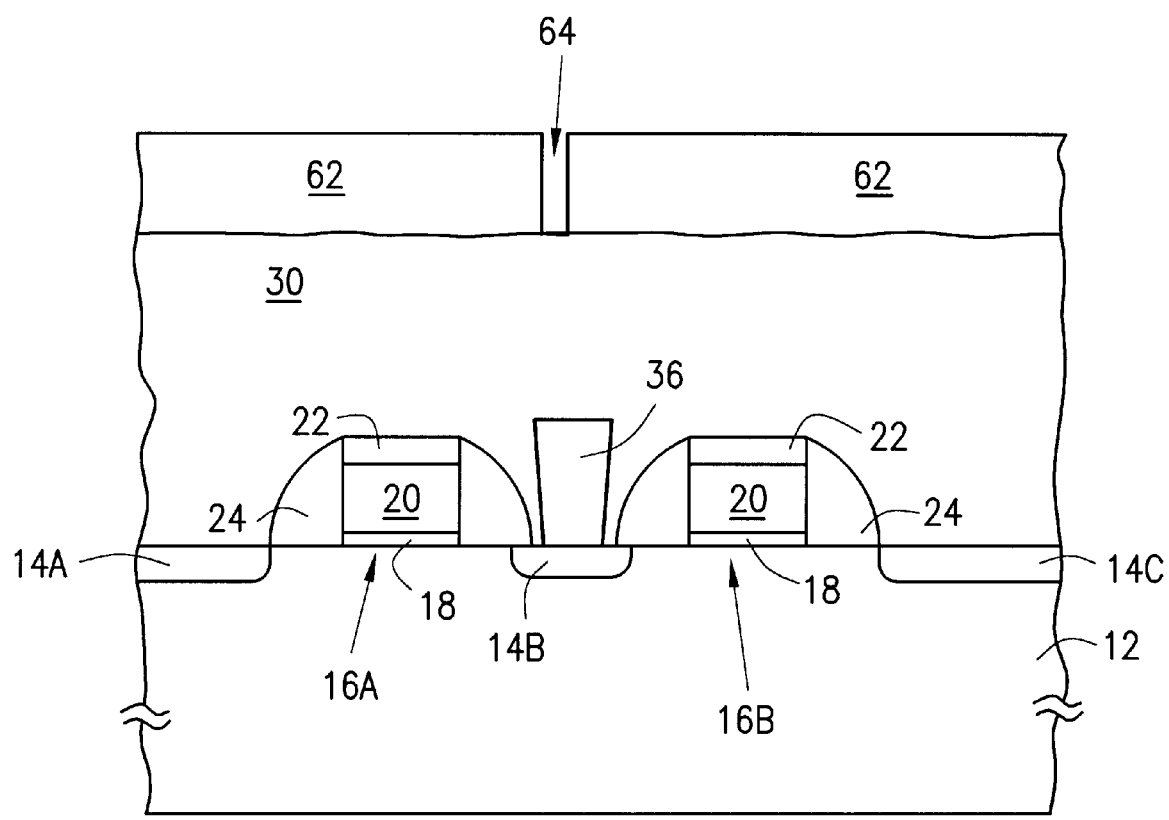
FIGS. 10, 11 and 12 illustrate cross-sections of the structure of FIG. 2 during various stages in the fabrication of the contact to the plug.

Referring to FIG. 10, the formation of the contact 38 begins with the insulating layer 30 already formed over a conductive element, in this case the plug 36. A photoresist pattern or mask 62 with a via opening 64 is provided over the upper surface of the insulating layer 30.

Figure 11:
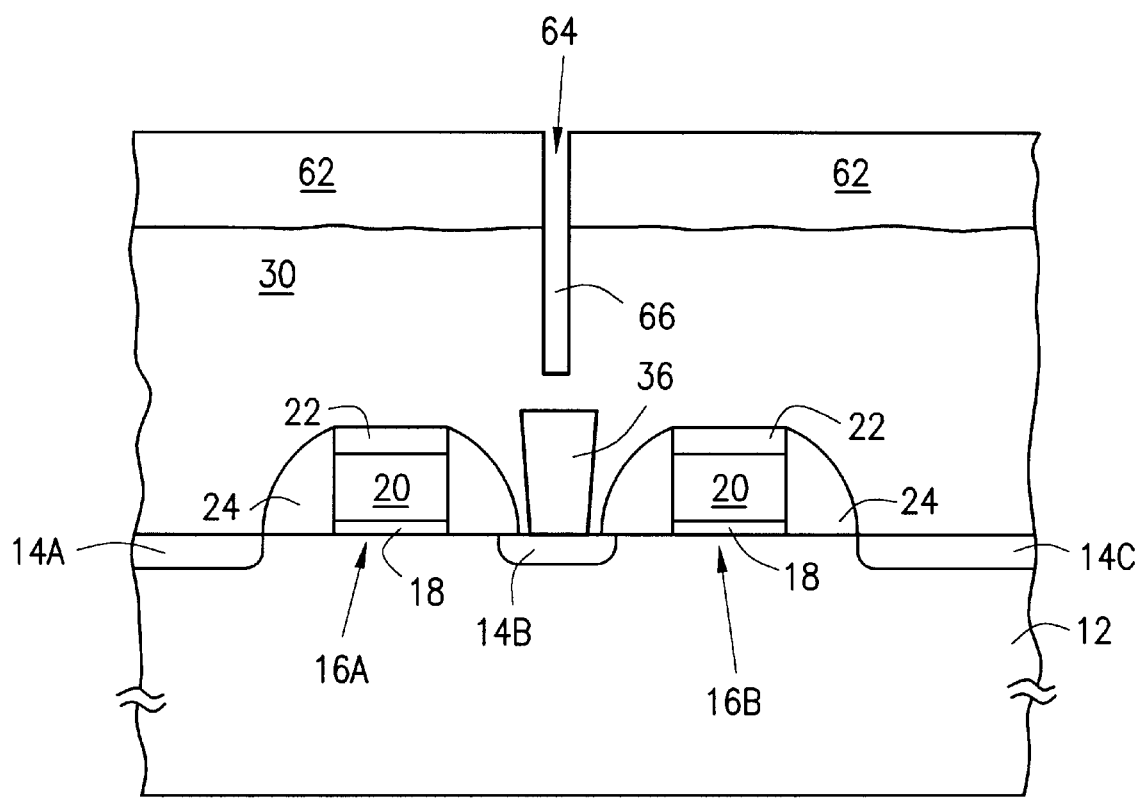

With the photoresist mask 62 in place, a via 66 is etched in the upper portion of the insulating layer 30 to a predetermined distance from the top of the plug 36, as shown in FIG. 11. This initial etch of the via 66 can be performed, for example, using an anisotropic RIE etch with a gaseous plasma based on fluorinated hydrocarbons. In one implementation, the via 66 is etched to within about 1,000 Å from the top of the plug 36. The duration of the etch can be determined experimentally, although other techniques, such as those described above, can be used as well.

Once the initial etch of the contact via 66 is completed, the photoresist pattern 62 is stripped or removed in an oxygen-based ambient, for example, using an oxygen plasma.

Figure 12:
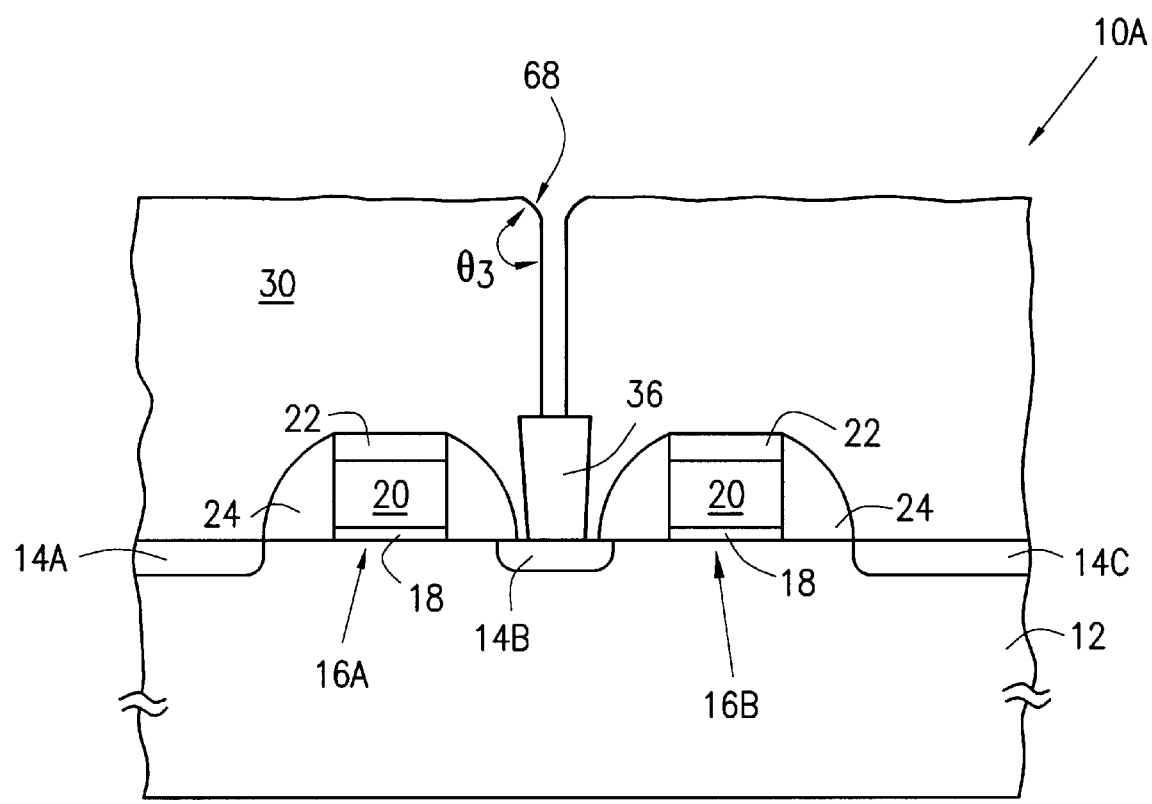

To complete formation of the via 66, a blanket anisotropic etch across the entire surface of the wafer is performed. In other words, an etch process is performed in the absence of a photoresist pattern on the surface of the wafer. The duration of this etch process should be sufficiently long so that the via 66 extends through the insulating layer 30 to expose the plug 36 at the bottom of the via (FIG. 12). This etch can be performed using the same RIE or other etch techniques discussed above.

Figure 2:
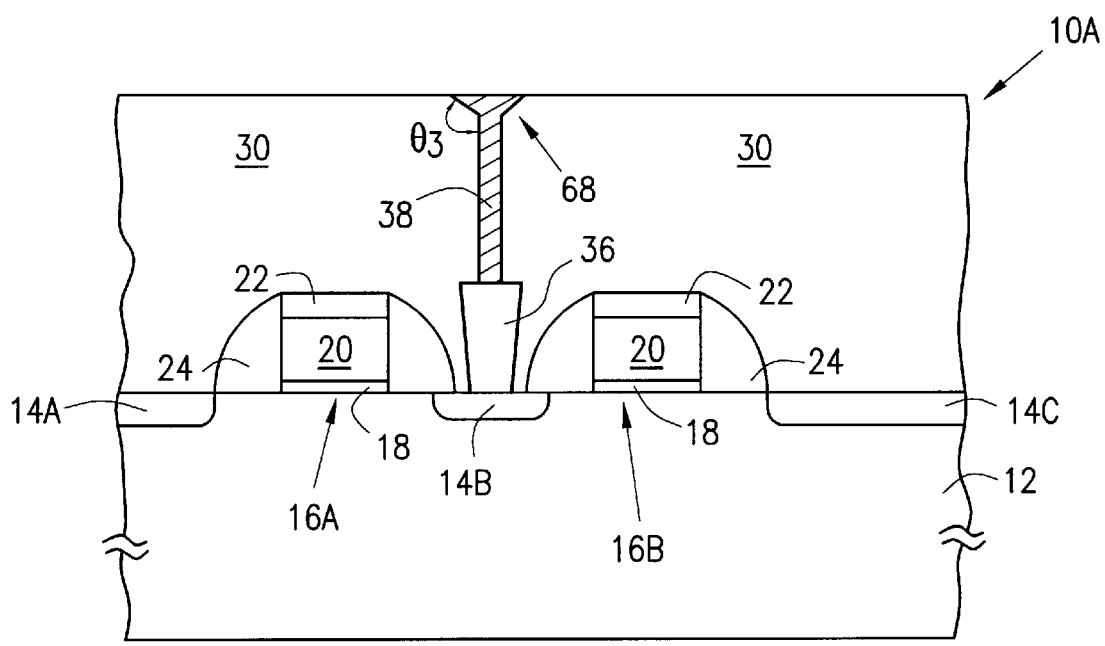
FIG. 2 illustrates a cross-section of an exemplary integrated circuit with a contact electrically connected to a conductive plug according to the invention.

As a result of the blanket etch, there will generally be less faceting at the upper side edges 68 of the via 66. Thus, the exterior angle $\theta_3$ between the substantially vertical sidewalls of the opening 66 and the edges 68 can be greater than ninety degrees and less than one-hundred and eighty degrees. In some implementations, the edges 68 may slope at an angle of about forty-five degrees or more, thereby resulting in an exterior angle of about 135 degrees or more. As already noted, that feature can facilitate subsequent filling of the openings 26, 32 with a conductive material. Thus, following completion of the via 66 to expose the plug 36, the via is filled with Cu or another conductive material to form the contact 38, as shown in FIG. 2. Excess metal over the wafer surface can be removed either by a chemical-mechanical polishing process or by an etchback process. Additional layers, such as a passivation layer, can be provided over the contact 38 using known techniques.

Other implementations are within the scope of the following claims.

What is claimed is:

1. A method of fabricating a contact for electrical connection to a conductive element of an integrated circuit, the method comprising:
   partially forming a via in a layer over the conductive element, wherein the via is defined by an opening in a photoresist pattern;
   removing the photoresist pattern prior to exposure of the conductive element at a bottom of the via;
   subsequently performing a blanket etch to expose the conductive element at the bottom of the via, said blanket etch forming a first set of sloping upper side edges and a second set of sloping upper side edges, said first set of sloping upper side edges being connected to a first set of substantially vertical sidewalls and forming an exterior angle greater than ninety degrees and less than one hundred eighty degrees, said second set of sloping upper side edges being connected to a second set of substantially vertical sidewalls and forming an exterior angle greater than ninety degrees and less than one hundred eighty degrees, the first set of sloping upper edges connected to the second set of substantially vertical sidewalls; and
   filling the via with a conductive material.

2. The method of claim 1 wherein performing a blanket etch includes performing an anisotropic dry etch.

3. The method of claim 1 wherein performing a blanket etch includes performing a reactive ion etch.

4. The method of claim 1 wherein removing the photoresist pattern includes stripping the photoresist pattern in an ambient comprising oxygen.

5. The method of claim 4 wherein stripping the photoresist pattern includes heating the photoresist in an oxygen-based plasma.

6. A method of fabricating an electrical contact for an integrated circuit on a semiconductor wafer, the method comprising:
   providing a passivation layer over a conductive element on the wafer, wherein the conductive element comprises a material that is oxidizable;
   etching a contact opening in the passivation layer, wherein the contact is defined by a photoresist pattern over the passivation layer;
   removing the photoresist pattern in an ambient comprising oxygen prior to exposure of the conductive element at a bottom of the contact opening;
   subsequently performing a blanket etch across the wafer to expose the conductive element at the bottom of the contact opening, said blanket etch forming a first set of sloping upper side edges and a second set of sloping upper side edges, said first set of sloping upper side edges being connected to a first set of substantially vertical sidewalls and forming an exterior angle greater than ninety degrees and less than one hundred eighty degrees, said second set of sloping upper side edges being connected to a second set of substantially vertical sidewalls and forming an exterior angle greater than ninety degrees and less than one hundred eighty degrees, the first set of sloping upper edges connected to the second set of substantially vertical sidewalls; and
   filling the contact opening with a conductive material.

7. The method of claim 6 wherein removing the photoresist pattern includes heating the wafer in an oxygen-based plasma.

8. The method of claim 6 wherein performing a blanket etch includes performing an anisotropic etch.

9. The method of claim 6 wherein performing a blanket etch includes performing a reactive ion etch.

10. A method of fabricating a contact for electrical connection to a conductive element of an integrated circuit, the method comprising:
   providing an insulating layer over the conductive element, wherein the insulating layer comprises a first sub-layer and a second sub-layer above the first sub-layer;
   etching the insulating layer to form a contact opening, wherein the contact opening is defined by a photoresist pattern;

halting etching of the insulating layer when the first sub-layer becomes exposed;

removing the photoresist pattern;

performing a blanket etch to expose the conductive element at the bottom of the contact opening after removal of the photoresist pattern, said blanket etch forming a first set of sloping upper side edges and a second set of sloping upper side edges, said first set of sloping upper side edges being connected to a first set of substantially vertical sidewalls and forming an exterior angle greater than ninety degrees and less than one hundred eighty degrees, said second set of sloping upper side edges being connected to a second set of substantially vertical sidewalls and forming an exterior angle greater than ninety degrees and less than one hundred eighty degrees, the first set of sloping upper edges connected to the second set of substantially vertical sidewalls; and filling the contact opening with a conductive material.

11. The method of claim 10 wherein the step of halting further comprises halting when the etching of the first sub-layer has been detected.

12. The method of claim 10 wherein providing an insulating layer includes providing first and second sub-layers of different materials.

13. The method of claim 12 wherein etching the insulating layer includes performing a reactive ion etch.

14. The method of claim 13 wherein performing a reactive ion etch includes providing a reactant gas comprising a fluorine-based compound.

15. The method of claim 13 wherein an etch rate of the first sub-layer is less than an etch rate of the second sub-layer using an reactant gas.

16. A method of fabricating a dual damascene structure for electrical connection to a conductive element in an integrated circuit, the method comprising:

partially forming, in an insulating layer over the conductive element, an opening for a conductive line and a via opening for interconnection between he conductive line and the conductive element using a plurality of photoresist masks;

removing the plurality of photoresist masks prior to exposure of the conductive element at a bottom of the via opening;

subsequently performing a blanket etch to expose the conductive element at the bottom of the via opening, said blanket etch forming a first set of sloping upper side edges and a second set of sloping upper side edges, said first set of sloping upper side edges being connected to a first set of substantially vertical sidewalls and forming an exterior angle greater than ninety degrees and less than one hundred eighty degrees, said second set of sloping upper side edges being connected to a second set of substantially vertical sidewalls and forming an exterior angle greater than ninety degrees and less than one hundred eighty degrees, the first set of sloping upper edges connected to the second set of substantially vertical sidewalls; and filling the opening for the conductive line and the via opening with a conductive material.

17. The method of claim 16 further including providing an oxidizable material as the conductive element.

18. The method of claim 16 further including providing a material comprising copper as the conductive element.

19. The method of claim 16 wherein removing the photoresist masks includes stripping the masks using an oxygen-based plasma.

20. The method of claim 16 wherein partially forming an opening for a conductive line and a via opening includes anisotropically etching the insulating layer.

21. A method of fabricating a dual damascene structure for electrical connection to a conductive element in an integrated circuit, the method comprising:

etching an insulating layer provided over the conductive element to partially form an opening for a conductive line and a via opening for interconnection between the conductive element and the conductive line, wherein said etching removes at least one of a plurality of photoresist masks;

halting the etching prior to exposure of the conductive element at a bottom of the via opening;

subsequently etching the insulating layer in the absence of a photoresist mask to expose the conductive element at the bottom of the via opening, said etching forming a first set of sloping upper side edges and a second set of sloping upper side edges, said first set of sloping upper side edges being connected to a first set of substantially vertical sidewalls and forming an exterior angle greater than ninety degrees and less than one hundred eighty degrees, said second set of sloping upper side edges being connected to a second set of substantially vertical sidewalls and forming an exterior angle greater than ninety degrees and less than one hundred eighty degrees, the first set of sloping upper edges connected to the second set of substantially vertical sidewalls; and filling the opening for the conductive line and the via opening with a conductive material.

22. The method of claim 21 wherein the step of halting the etching comprises etching the insulting layer for a predetermined duration.

23. The method of claim 21 wherein the etching comprises performing a first etch process with a first mask defining the via opening and performing a second etch process with a second mask defining the opening for the conductive line.

24. The method of claim 23 wherein the insulating layer includes a plurality of sub-layers, and wherein the step of halting the etching comprises detecting etching of a particular one of the sub-layers.

25. A method of fabricating a dual damascene structure for electrical connection to a first conductive element of an integrated circuit, the method comprising:

providing a first mask over an insulating layer on the conductive element to define a via opening;

performing a first etch of the insulating layer to partially form the via opening;

removing the first mask in an ambient comprising oxygen;

aligning a second mask over the via opening to define an opening for a conductive line;

performing a second etch prior to exposure of the conductive element at a bottom of the via opening;

removing the second mask using an ambient comprising oxygen;

subsequently performing a blanket etch to expose the conductive element at the bottom of the via opening, said blanket etch forming a first set of sloping upper side edges and a second set of sloping upper side edges, said first set of sloping upper side edges being connected to a first set of substantially vertical sidewalls and forming an exterior angle greater than ninety degrees and less than one hundred eighty degrees, said second set of sloping upper side edges being connected to a second set of substantially vertical sidewalls and forming an exterior angle greater than ninety degrees and less than one hundred eighty degrees, the first set of sloping upper edges connected to the second set of substantially vertical sidewalls; and filling the opening for the conductive line and the via opening with a conductive material.

26. The method of claim 25 further including providing an oxidizable material as the conductive element.

27. The method of claim 25 further including providing a material comprising copper as the conductive element.

28. The method of claim 25 wherein aligning a second mask includes providing a mask having a second opening which is wider than the via opening defined by the first mask.

29. The method of claim 25 wherein each of the etches is an anisotropic etch.

30. The method of claim 29, wherein performing each of the etches includes using a gaseous plasma based on a fluorinated hydrocarbon.

* * * * *